United States Patent
Chen et al.

(10) Patent No.: US 6,245,626 B1
(45) Date of Patent: Jun. 12, 2001

(54) METHOD OF FABRICATING A MOS DEVICE USING A SACRIFICIAL LAYER AND SPACER

(75) Inventors: Chun-Lung Chen, Tainan Hsien; Hsi-Mao Hsiao, Hsinchu; Hsi-Chin Lin; Wen-Hua Cheng, both of Hsinchu Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/348,395

(22) Filed: Jul. 7, 1999

(51) Int. Cl.[7] .................................................. H01L 21/336

(52) U.S. Cl. .............................................. 438/305; 438/595

(58) Field of Search .................................... 438/305, 306, 438/307, 595, 655, 656

(56) References Cited

U.S. PATENT DOCUMENTS

| | | | | |
|---|---|---|---|---|
| 5,015,598 | * | 5/1991 | Verhaar | 438/305 |
| 5,221,632 | * | 6/1993 | Kurimoto et al. | 438/305 |
| 5,672,544 | * | 9/1997 | Pan | 438/305 |
| 6,046,105 | * | 4/2000 | Kittl et al. | 438/655 |

* cited by examiner

Primary Examiner—Chandra Chaudhari
(74) Attorney, Agent, or Firm—Thomas, Kayden, Horstemeyer & Risley

(57) ABSTRACT

A method of fabricating a MOS transistor. A substrate has a gate formed thereon and a LDD is formed in the substrate beside the gate. A spacer is formed on the sidewall of the gate. A sacrificial layer is formed over the substrate to cover the gate and the spacer. A portion of the sacrificial layer is removed to expose a portion of the spacer. The exposed spacer is removed, such that a portion of the gate sidewall is exposed. The sacrificial layer is removed. A source/drain region is then formed in the substrate beside the spacer.

17 Claims, 2 Drawing Sheets

METHOD OF FABRICATING A MOS DEVICE USING A SACRIFICIAL LAYER AND SPACER

BACKGROUND OF THE INVENTION

1. Field of Invention

The present invention relates to fabrication of a semiconductor device. More particularly, the present invention relates to a method of fabricating a metal-oxide-semiconductor transistor (MOS transistor).

2. Description of Related Art

As the integration of the semiconductor device is increased, the size of the device is gradually decreased according to the reduced design rule. However, the resistance of the circuit becomes higher and higher when the material of the wiring line remains the same while the size is reduced.

Some methods to overcome the high sheet resistance of the poly gate and the source/drain junction have been developed in prior technique. One such method is a self-aligned silicide (salicide, SAC) process. SAC forms a metal silicide layer on the surface of the poly gate and the source/drain region, such that the sheet resistance of the poly gate and the source/drain region is lowered.

However, in the deep sub-micron level of semiconductor process, the surface area of the poly gate and the source/drain region provided to form a salicide becomes quite small, which results in a narrow line-width effect in the fabrication of salicide. In order to increase the area for salicide formation, the spacer beside the gate is over-etched to lower the height of the spacer so as to expose an upper edge of the poly gate sidewall, such that the area for forming the salicide is increased.

Although the high sheet resistance is improved by this method, other problems are created. The longer the spacer is over-etched, the shorter the spacer is, and the width of the spacer is reduced. The reduced width of the spacer causes relevant problems, such as a short channel effect due to the reduced width of the lightly doped drain (LDD). Therefore, it is difficult to control the time for which the spacer is over-etched. In addition, since the substrate surface of the source/drain region is exposed during over-etching, the substrate is easily damaged because of prolongation of etching time, which damage leads to current leakage.

SUMMARY OF THE INVENTION

The invention provides a method of fabricating a MOS transistor, thereby respectively controlling the width and the height of the spacer. The method not only provides enough space for the formation of salicide to reduce resistance of gate, but also control the width of the spacer, which prevents the reduction of spacer width varied by reduced height and avoids damage to the substrate.

As embodied and broadly described herein, the invention provides a method of fabricating a MOS transistor. A substrate has a gate formed thereon. An ion implantation is performed to form a LDD in the substrate beside the gate. A spacer is formed on the sidewall of the gate. A sacrificial layer is formed over the substrate to cover the gate and the spacer. A portion of the sacrificial layer is removed until the sacrificial layer level is lower than the gate, such that a portion of the spacer is exposed. Thereafter, using the sacrificial layer as a stop layer, the exposed spacer is removed to expose a portion of the sidewall of the gate. The sacrificial layer is then removed. A source/drain region is then formed in the substrate beside the spacer by a heavy ion implantation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
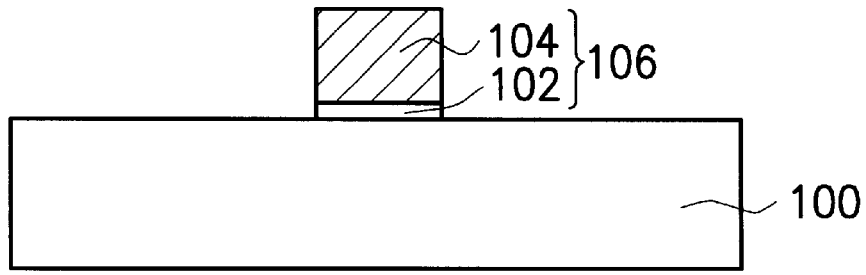
FIGS. 1A–1F are schematic, cross-sectional views illustrating fabrication of a MOS transistor according to one preferred embodiment of this invention.

Referring to FIG. 1A, a gate 106 including a gate oxide layer 102 and a conductive layer 104 is formed on a substrate 100. The gate oxide layer 102 can be formed by thermal oxidation, for example, and the conductive layer 104 such as a polysilicon layer can be formed by chemical vapor deposition (CVD). The gate oxide layer 102 and the conductive layer 104 are patterned by photolithography to form the gate 106.

Figure 1B:
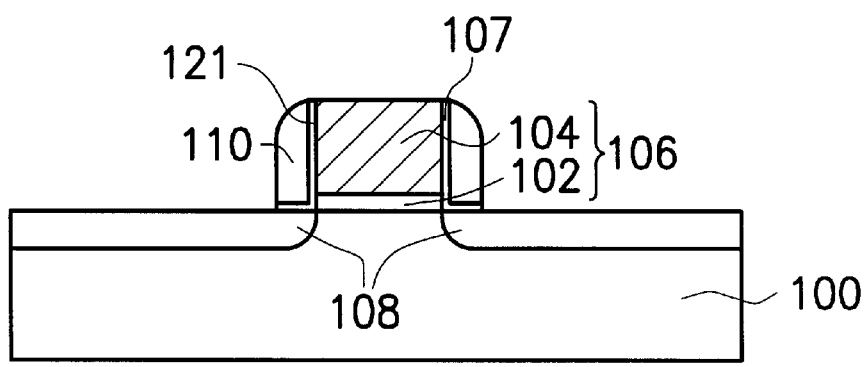

Referring to FIG. 1B, a lightly doped drain (LDD) 108 is formed in the substrate 100 beside the gate 106. The LDD 108 can be formed by performing a light ion implantation on the substrate 100. Thereafter, a spacer 110 is formed on a sidewall 121 of the gate 102. The spacer 110 can be formed by forming an insulating layer (not shown) on the substrate 100 by CVD followed by etching back the insulating layer. Accordingly, a portion of the insulating layer is removed by dry etching, such that the spacer 110 is formed. The spacer 110 can be made of silicon nitride.

The spacer 110 is formed by a conventional method, that is, it is not necessary to over-etch the spacer 110 to lower the height of the spacer 110 when the insulating layer is etched back, such that the spacer 110 is as high as the gate 106. Therefore, damages due to over-etching do not occur in the LDD 108 of the substrate 100. In addition, the width of the spacer 110 can be controlled by the thickness of the insulating layer and the over-etching step.

As illustrated in FIG. 1B, alternatively, a thin liner oxide layer 107 is formed on the sidewall 121 of the gate 106 prior to the formation of the spacer 110. The liner oxide layer 107 with a thickness of about 100–200 angstroms can be formed by thermal oxidation or CVD, for example. The presence of the liner oxide layer 107 enhances the adhesion and the stress between the spacer 110 and the gate 106.

Figure 1C:
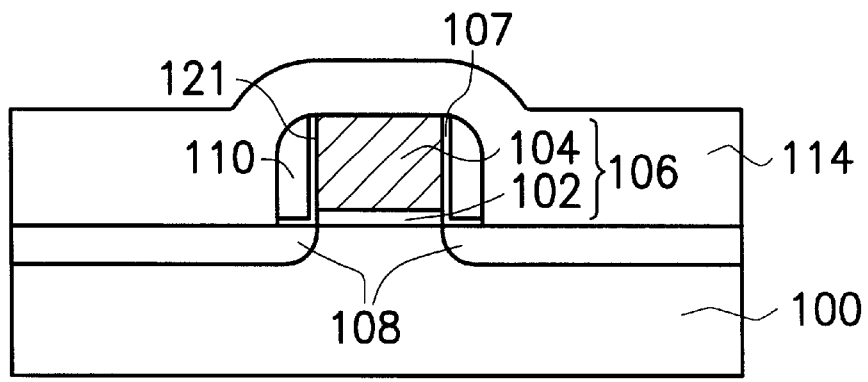

Referring to FIG. 1C, a sacrificial layer 114 is formed over the substrate 100 to cover the spacer 110 and the gate 106. The sacrificial layer 114 can be a silicon oxide layer, which is formed by CVD or PECVD, or a spin-on-glass (SOG), for example.

Figure 1D:
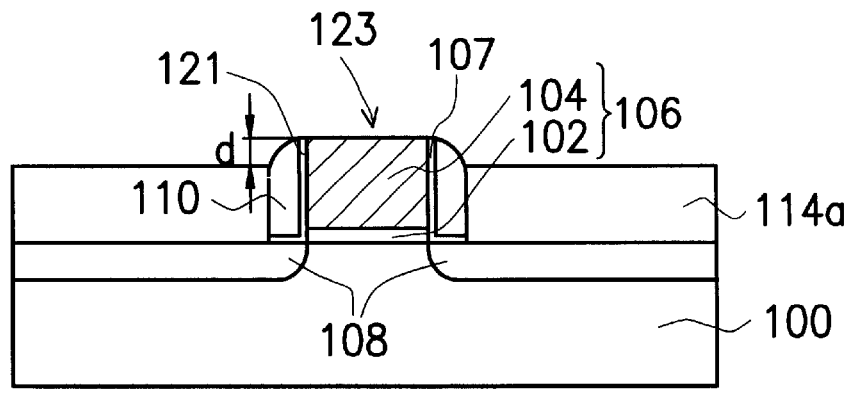

Referring to FIG. 1D, a portion of the sacrificial layer 114 is then removed by etching back until the sacrificial layer 114a level is lower than the top surface 123 of the gate 106. Accordingly, a portion of the spacer 110 is exposed. The distance d from the top surface 123 of the gate 106 to the sacrificial layer 114a is controlled by this etching step, which also determines the exposed area of the spacer 110.

Figure 1E:
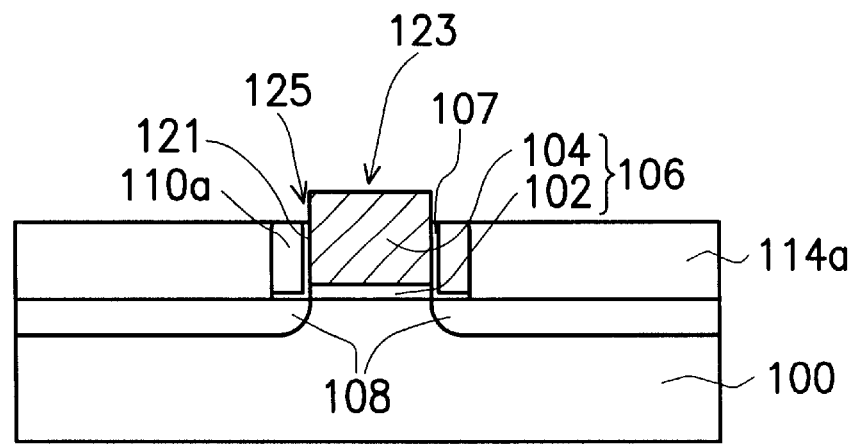

As shown in FIG. 1E, using the sacrificial layer 114a as a stop layer, the exposed spacer 110, which is exposed by the sacrificial layer 114a is removed by a method such as wet etching. Therefore, a recess 125 is formed on the upper edge of the gate 106 to let spacer 110 become spacer 110a, which is shorter than the spacer 110 (FIG. 1D). Accordingly, a portion of the sidewall 121 of the gate 106 is exposed, such that the exposed surface of the gate 106 is increased due to the upper edge of the gate 106 being exposed by the spacer 110a.

The etching step controls the height of the spacer 110a and as a result, the exposed area of the gate 106 is determined. The reduction in the width of the spacer 110a due to the etching step does not occur, so that the related problems due to a reduced spacer, such as a short channel effect, are avoided. Therefore, the width and height of the spacer 110a can be independently decided in the embodiment of the invention, such that the required spacer is formed.

Figure 1F:
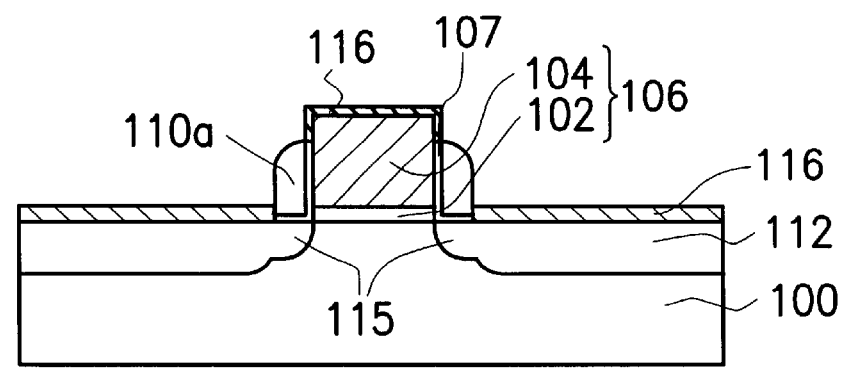

Referring to FIG. 1F, the sacrificial layer 114a is removed by wet etching, for example. Thereafter, an ion implantation, such as a heavy ion implantation, is performed on the substrate 100 to form a source/drain region 112 in the substrate 100 beside the gate 106. A salicide process is carried out to form a silicide 116 on the exposed surface of the gate 106 and the source/drain region 112, thereby reducing the contact resistance. The silicide layer 116 can be $TiSi_x$, $CoSi_x$, $MoSi_2$, $Pd_2Si$, $PtSi$, $TaSi_2$ or $WSi_2$.

As illustrated in the embodiment of the invention, the height and the width of the spacer can be respectively controlled by the processes, such that no damage occurs on the source/drain region. Since the exposed area of the gate is increased, the narrowed line width is prevented. As a result, the contact resist of the gate is enhanced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a MOS transistor adapted to a substrate having a gate, the substrate having a LDD formed beside the gate, the method comprising:

forming a spacer on a sidewall of the gate;

forming a sacrificial layer over the substrate;

exposing a portion of the spacer by removing a portion of the sacrificial layer;

exposing an upper edge of the gate sidewall by removing the exposed spacers, using the sacrificial layer as a stop layer;

removing the sacrificial layer; and forming a source/drain region in the substrate beside the spacer.

2. The method according to claim 1, wherein the sacrificial layer is made of SOG.

3. The method according to claim 1, wherein the sacrificial layer is made of silicon oxide by PECVD.

4. The method according to claim 1, wherein the spacer is made of silicon nitride.

5. The method according to claim 1, wherein a liner oxide layer is further formed on the sidewall of the spacer before the spacer is formed.

6. The method according to claim 1, after the step of forming the source/drain region, further comprising forming a silicide layer on the gate and the source/drain region.

7. A method of fabricating a MOS transistor adapted to a substrate having a gate formed thereon, and a LDD formed in the substrate beside the gate; the method comprising:

forming a first spacer on a sidewall of the gate;

forming a sacrificial layer over the substrate to cover the gate and the first spacer;

removing a portion of the sacrificial layer until the sacrificial layer is lower than the gate;

using the sacrificial layer as a stop layer to remove a portion of the first spacer, such that a second spacer lower than the first spacer is formed and an upper edge of the gate sidewall is exposed;

removing the sacrificial layer to expose the substrate; and heavily doping the substrate beside the second spacer to form a source/drain region.

8. The method according to claim 7, wherein the sacrificial layer is made of SOG.

9. The method according to claim 7, wherein the sacrificial layer is made of silicon oxide by PECVD.

10. The method according to claim 7, wherein the spacer is made of silicon nitride.

11. The method according to claim 7, wherein a liner oxide layer is further formed on the sidewall of the spacer before the step of forming the spacer.

12. The method according to claim 7, after the step of forming the source/drain region further comprising forming a silicide layer on the gate and the source/drain region.

13. A method of fabricating a MOS transistor adapted to a substrate, the method comprising:

forming a gate on the substrate;

forming a LDD in the substrate beside the gate;

forming a first spacer on a sidewall of the gate, wherein the first spacer is as high as the gate;

forming a sacrificial layer on the gate, the first spacer and the substrate;

etching back the sacrificial layer until a portion of the spacer is exposed;

removing the exposed portion of the first spacer using the sacrificial layer as a stop layer, such that a second spacer lower than the first spacer is formed and an upper edge of the sidewall of the gate is exposed;

removing the sacrificial layer to expose the substrate and the second spacer, heavily doping the substrate beside the second spacer to form a source/drain region; and forming a silicide layer on the gate and the source/drain region.

14. The method according to claim 13, wherein the sacrificial layer is made of SOG.

15. The method according to claim 13, wherein the sacrificial layer is made of silicon oxide by PECVD.

16. The method according to claim 13, wherein the spacer is made of silicon nitride.

17. The method according to claim 13, wherein a liner oxide layer is further formed on the sidewall of the spacer before the step of forming the spacer.

* * * * *